Figure 1:
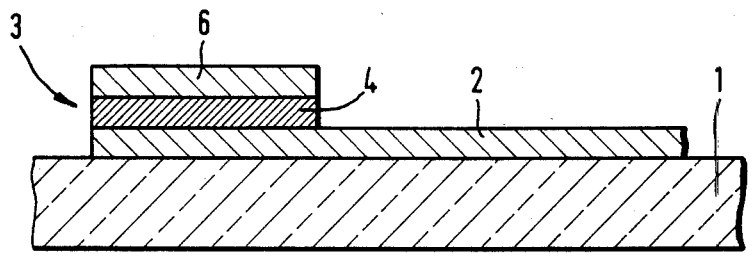

United States Patent [19]

Nickol et al.

[11] Patent Number: 4,500,611
[45] Date of Patent: Feb. 19, 1985

[54] SOLDERABLE LAYER SYSTEM

[75] Inventors: Friedrich W. Nickol; Holm Baeger, both of Schwalbach, Fed. Rep. of Germany

[73] Assignee: VDO Adolf Schindling AG, Frankfurt am Main, Fed. Rep. of Germany

[21] Appl. No.: 286,102

[22] Filed: Jul. 22, 1981

[30] Foreign Application Priority Data

Jul. 24, 1980 [DE] Fed. Rep. of Germany ....... 3028044

[51] Int. Cl.$^3$ .............................................. C23C 17/00
[52] U.S. Cl. .................................... 428/686; 428/641; 428/642; 428/647; 428/648; 428/450; 428/629; 428/632; 428/633; 148/31.5
[58] Field of Search .............. 428/642, 632, 633, 629, 428/686, 641, 642, 648; 148/31.5; 357/71

[56] References Cited

U.S. PATENT DOCUMENTS

| 3,367,755 | 2/1968 | Parker et al. | 428/642 |
| 3,620,692 | 11/1971 | Franklin et al. | 428/664 |
| 4,095,876 | 6/1978 | Horsting et al. | 357/71 |
| 4,255,474 | 3/1981 | Smith, Jr. | 428/642 |
| 4,283,118 | 8/1981 | Inoue | 357/71 |
| 4,352,716 | 10/1982 | Schnaible et al. | 428/632 |

OTHER PUBLICATIONS

Merriman, A. D.; *A Dictionary of Metallurgy*, McDonald & Evans, pp. 46, 328, (1958).

*Primary Examiner*—Veronica O'Keefe
*Attorney, Agent, or Firm*—Martin A. Farber

[57] ABSTRACT

A corrosion-resistant solderable layer system is connected to an unsolderable layer, the layer system and the unsolderable layer being applied to a support and comprises a solderable layer and an anti-corrosion layer which covers the solderable layer and protects the latter against oxidation. The anti-corrosion layer is made of an oxidizable metal.

11 Claims, 3 Drawing Figures

SOLDERABLE LAYER SYSTEM

The present invention relates to a corrosion-resistant solderable layer system which is applied to a support and consists of a solderable layer and an anti-corrosion layer which covers the latter and protects against oxidation.

In such a layer system it is known to apply to a support a bond-producing layer which bears the solderable layer. The bond-producing layer serves for the better bonding of the solderable layer to the support. In order that the solderable layer, which consists preferably of copper or iron, does not corrode it is covered by an anti-corrosion layer of gold. This layer of gold prevents oxygen from gaining access to the solder layer. Since, however, upon the direct application of the layer of gold to the solderable layer at least partial mixing of these two layers would take place, a diffusion barrier layer of, for instance, palladium, nickel or platinum is also applied between the gold and the solderable layer.

Such a layer system is very expensive, on the one hand, due to the required expensive method of manufacture which requires four successive process steps for the four layers and due to the gold which is used as an anti-corrosion layer.

The object of the present invention is therefore to create a layer system in accordance with the type of the introduction which can be manufactured in a simple and economical manner.

In accordance with the invention, the anti-corrosion layer (6, 6', 6'') is made of an oxidizable metal. The thin anti-corrosion layer may in this case preferably be made of silicon, tin or indium, which have the advantage of being considerably cheaper than the gold traditionally used. However, it is also possible for the anti-corrosion layer to be made of a partially oxidized or completely oxidized metal compound, preferably compounds of silicon, tin or indium.

Since these substances do not mix with the solderable layer, which consists preferably of copper or iron, the traditionally customary diffusion barrier layer is dispensed with, so that cost of material and manufacture is reduced.

The anti-corrosion layer of the invention, insofar as it comprises non-oxidized or partially oxidized materials, acts as a captive layer for oxygen which has penetrated and at the same time as a reducing agent for the material of the solderable layer.

If the anti-corrosion layer consists of the oxidized compounds of, for instance, silicon, tin or indium, then, if the layer is sufficiently thick, it serves as an impervious barrier layer for oxygen.

The anti-corrosion layer (6, 6', 6'') may be of such thickness that diffusion of oxygen to the solderable layer (4) is at least substantially prevented. The layer in this connection is so minimized in thickness that only a small amount of oxygen can diffuse through the anti-corrosion layer and merely oxidize the surface of the solderable layer.

In the event that the thickness of the anti-corrosion layer is thus minimized, it is not necessary to remove the anti-corrosion layer in a separate process in order to effect the soldering since the layer is somewhat porous and, upon the soldering, the solder passes through the porous places of the anti-corrosion layer and the possible oxide of the solderable layer material down to the solderable layer material and thus produces the contact.

If the thickness of the anti-corrosion layer is selected so large that the solderable layer material is fully protected against oxidation then the anti-corrosion material or the oxide of this material which is formed in a high temperature process must be removed by an etching agent suitable for this material before the soldering process takes place.

Since an at least partial removal by oxidation of the solderable layer is prevented by the invention, the solderable layer can be applied in a minimized thickness, which, in contrast to the previous galvanic application of the solderable layer, permits application by the much less expensive vacuum technique. Solderable layers of a thickness of less than 1 $\mu$m are thereby possible.

The minimum required thickness of the anti-corrosion layer is determined by the material used and the degree of oxidation of this material, so that the thickness of the anti-corrosion layer can also be varied by varying these two parameters.

In order to obtain a good bonding of the solderable layer to the support, made for instance of glass, silicon, epoxide or ceramic, a bond-producing layer of, for instance, chromium, titanium or aluminum can be arranged between the support and the solderable layer.

In one advantageous application of the invention, the layer system may be a solderable connection point of the conductor layer of a liquid crystal display, the conductor layer being possibly a substantially completely oxidized metal. Such conductor layers are customarily applied initially in only partially oxidized form onto the support which is made of glass and then, after the other layers of the solderable layer system have also been applied, fully oxidized in a high-temperature process. This complete oxidation is necessary in order, on the one hand, to obtain a reduction in resistance and on the other hand to obtain the required transparency of the conductor layer. Such the solderable layer system also passes through this high-temperature process, the anti-corrosion layer is of particular importance since otherwise the solderable layer is at least partially removed by oxidation during the high-temperature process.

In order to produce the electric contact between the conductor layer and the solderable layer system, the conductor layer can extend into the region between the support and solderable layer. In this case it can, at the same time, form the bond-producing layer (5) between the support (1) and the solderable layer (4).

However, in order to obtain a particularly good adherence between the solderable layer and the support, a bond-producing layer can also be provided between the conductor layer and the solderable layer.

Since indium tin oxide can be used for the conductor layer in the same way as for the anti-corrosion layer, the anti-corrosion layer and the conductor layer can consist of the same material. This is particularly advantageous when the anti-corrosion layer (6'') and conductor layer are applied so as to cover the layer system (3'') (consisting of the solderable layer (4) and possibly additional layers) as well as the surface of the support (1) not covered by the layer system, in a single operation. In this case, instead of the traditionally customary five operations for the application of the conductor layer, the bond-producing layer, the solderable layer, the diffusion barrier layer and the anti-corrosion layer, only three operations are necessary in order to apply the bond-producing layer, the solderable layer and the anti-corrosion solderable layers, which latter layers are applied simultaneously in one operation, onto the support.

If, as is necessary in the case of liquid crystal displays, an orientation layer is also applied to the anti-corrosion layer (6, 6', 6''), the thickness of the anti-corrosion layer can be further reduced, since the orientation layer also serves to prevent diffusion of oxygen to the solderable layer.

Figure 2:
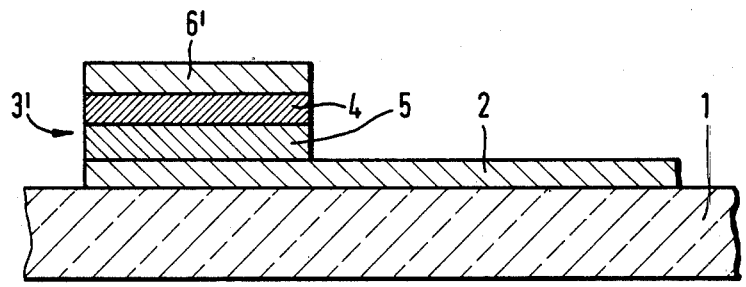
Figure 3:
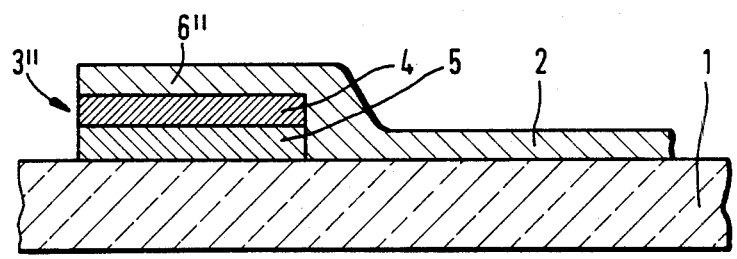

With the above and other objects and advantages in view, the present invention will become more clearly understood in connection with the detailed description of preferred embodiments, when considered with the accompanying drawings, of which:

FIG. 1 shows a first embodiment of a layer system in accordance with the invention in cross-section, FIG. 2 shows a second embodiment of a layer system in accordance with the invention, and FIG. 3 shows a third embodiment of a layer system in accordance with the invention.

The solderable layer systems 3, 3' and 3'' shown in the figures are applied to a support 1 of glass which serves as one wall of a liquid crystal cell.

Onto the support 1 there is applied a conductor layer 2 of a thickness of preferably 250 to 1500 Å, which may consist of indium tin oxide. For this non-solderable conductor layer 2 the layer systems 3, 3' and 3'' form solderable connection points via which, for instance, the leads of integrated circuits developed as chips can be connected to the conductor layer 2.

In the case of the layer system 3 shown in FIG. 1, a solderable layer (i.e., a solderable layer) 4 made of copper or iron is applied directly to the conductor layer 2, while in FIGS. 2 and 3 a bond-producing layer 5 of chromium, titanium or aluminum which improves the bonding to the support 1 is also provided between the solderable layer 4 and the conductor layer 2 in FIG. 2 and between the solderable layer 4 and the support in FIG. 3.

In order to protect the solder layer 4 from oxidation, it is covered by an anti-corrosion layer 6, 6' or 6'' respectively which consists of the same, preferably slightly oxidizable, material as the conductor layer 2.

While the anti-corrosion layers 6 and 6' of FIGS. 1 and 2 are applied in a separate operation, the application of the anti-corrosion layer 6'' and of the conductor layer 2 take place simultaneously in one operation in the case of the embodiment shown in FIG. 3.

After the application of the individual layers, which in the case of conductor layer 2 and anti-corrosion layers 6, 6' and 6'' respectively has been effected with only partially oxidized material, the entire assembly is subjected to a high-temperature process in which the anti-corrosion layers 6, 6' and 6'' and the conductor layer 2 are substantially completely oxidized. This is necessary in order, on the one hand, to reduce the electric resistance of the conductor layer and, on the other hand, to make the conductor layer 2 transparent. This transparency of the conductor layer is necessary upon use in a liquid-crystal cell.

Since there is no removal by oxidation of a part of the solderable layer 4 during the high-temperature process in view of the protection afforded by the anti-corrosion layer 6, 6' or 6'' respectively, the solderable layer can be applied in minimized manner, meaning that it need be only of a thickness of about 1 μm.

In an embodiment of the invention which has not been shown in the drawing, a layer of the material of the conductor layer can be applied to the support which support directly bears the bond-producing layer, the conductor layer then bearing the solderable layer and the anti-corrosion layer.

If the conductor layer is made namely of indium tin oxide then it penetrates in part as an alloy into the solderable layer. This leads to a better bonding of the entire system of layers both to each other and to the support. While several embodiments of the invention have been disclosed, it is to be understood that these embodiments are given by example only and not in a limiting sense.

What is claimed is:

1. In a corrosion-resistant solderable layer system, produced in a manufacturing stage of a transparent display device, said corrosion-resistant solderable layer system being connected at least indirectly to an unsolderable layer, the layer system and the unsolderable layer being applied to a support, and the layer system comprises a solderable layer and an anti-corrosion layer which covers the solderable layer and protects the latter against oxidation, the improvement in the layer system wherein the anti-corrosion layer is made of an oxidizable metal.

2. The layer system as set forth in claim 1, wherein the anti-corrosion layer is made of an at least partially oxidized metal compound.

3. The layer system as set forth in claim 1, wherein the anti-corrosion layer has a thickness such that diffusion of oxygen to said solderable layer is at least substantially prevented.

4. The layer system as set forth in claim 1, further comprising
a bond-producing layer between said support and said solderable layer.

5. The layer system as set forth in claim 6, wherein said oxidizable metal composition of the anti-corrosion layer exists prior to a high temperature oxidation process of a further manufacturing stage of the transparent display device, said high temperature oxidation process being capable of causing said conductor layer to become a substantially completely oxidized metal after the high temperature oxidation process.

6. The layer system as set forth in claim 1, wherein said unsolderable layer is a conductor layer on said support,
said solderable layer is between said anti-corrosion layer and said conductor layer.

7. The layer system as set forth in claim 6, further comprising
a bond-producing layer arranged next to said conductor layer.

8. The layer system as set forth in claim 7, wherein said bond-producing layer is arranged between said conductor layer and said solderable layer.

9. The layer system as set forth in claim 4 or 8, wherein
said bond-producing layer is electrically conducting.

10. The layer system as set forth in claim 1, wherein the oxidizable metal is selected from the group consisting of silicon, tin, indium, oxides of silicon, tin and indium,
the support is made of a material selected from the group consisting of glass, silicon, expoxide and ceramic, and
the unsolderable layer is indium tin oxide substantially of a thickness of 250 to 1500 Å.

11. The layer system as set forth in claim 5, wherein said conductor layer is indium tin oxide prior to the high temperature oxidation process.

* * * * *